US006956292B2

United States Patent
Fan et al.

(10) Patent No.: US 6,956,292 B2
(45) Date of Patent: Oct. 18, 2005

(54) BUMPING PROCESS TO INCREASE BUMP HEIGHT AND TO CREATE A MORE ROBUST BUMP STRUCTURE

(75) Inventors: Yang-Tung Fan, Jubei (TW); Cheng-Yu Chu, Hsinchu (TW); Fu-Jier Fan, Jubei (TW); Shih-Jane Lin, Hsinchu (TW); Chiou-Shian Peng, Hsinchu (TW); Yen-Ming Chen, Hsinchu (TW); Kuo-Wei Lin, Hsinchu (TW)

(73) Assignee: Taiwan Semiconductor Manufacturing Co., Ltd. (TW)

( * ) Notice: Subject to any disclaimer, the term of this patent is extended or adjusted under 35 U.S.C. 154(b) by 0 days.

(21) Appl. No.: 10/613,694

(22) Filed: Jul. 3, 2003

(65) Prior Publication Data

US 2004/0005771 A1 Jan. 8, 2004

Related U.S. Application Data

(62) Division of application No. 09/950,227, filed on Sep. 10, 2001, now Pat. No. 6,605,524.

(51) Int. Cl.[7] .............................................. H01L 23/48
(52) U.S. Cl. ....................... 257/780; 438/737; 438/738; 438/779
(58) Field of Search .......................... 438/613; 257/780, 257/779, 737, 738, 781

(56) References Cited

U.S. PATENT DOCUMENTS

| | | | | |
|---|---|---|---|---|
| 5,329,423 A | * | 7/1994 | Scholz | 361/760 |
| 5,597,737 A | * | 1/1997 | Greer et al. | 438/17 |
| 5,903,058 A | | 5/1999 | Akram | 257/778 |
| 5,904,156 A | | 5/1999 | Advocate, Jr. et al. | 134/2 |
| 5,914,274 A | | 6/1999 | Yamaguchi et al. | 438/690 |
| 6,211,052 B1 | | 4/2001 | Farnworth | 438/614 |
| 6,451,681 B1 | * | 9/2002 | Greer | 438/601 |
| 6,528,881 B1 | * | 3/2003 | Tsuboi | 257/738 |
| 6,620,720 B1 | * | 9/2003 | Moyer et al. | 438/612 |

* cited by examiner

*Primary Examiner*—Michael Trinh

(57) ABSTRACT

A new process is provided which is an extension and improvement of present processing for the creation of a solder bump. After the layers of Under Bump Metal and a layer of solder metal have been created in patterned and etched format and overlying the contact pad, following a conventional processing sequence, a layer of polyimide is deposited. The solder flow is performed using the thickness of the deposited layer of polyimide to control the height of the column underneath the reflown solder.

20 Claims, 6 Drawing Sheets

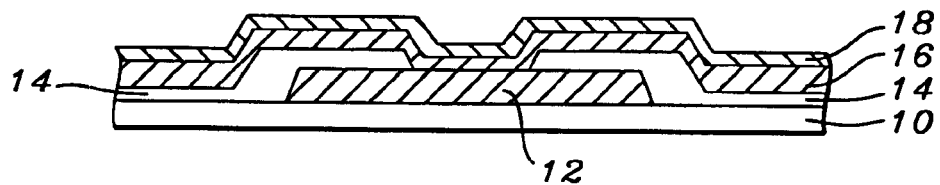
FIG. 1 — Prior Art
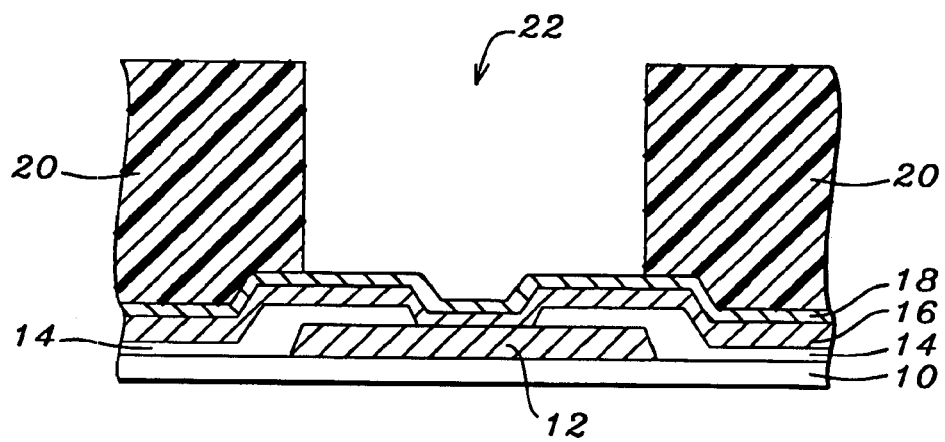
FIG. 2 — Prior Art
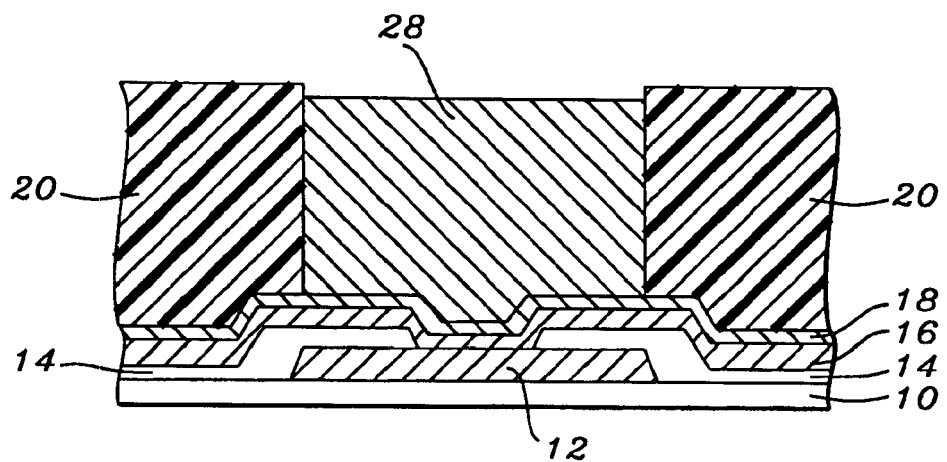
FIG. 3 — Prior Art

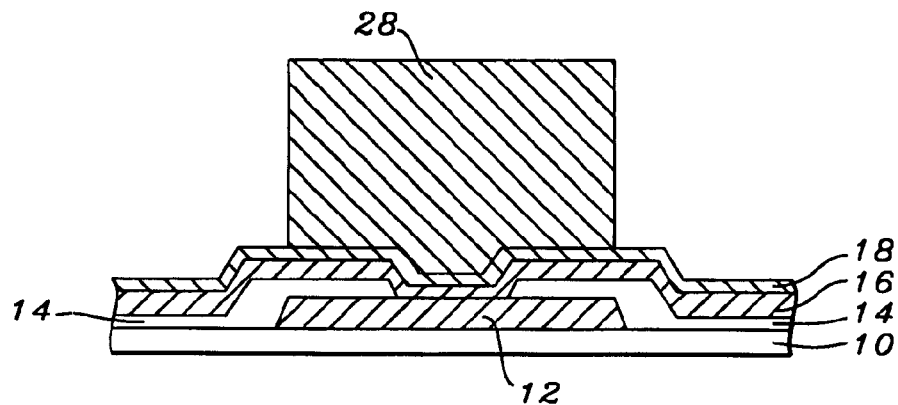
FIG. 4 – Prior Art
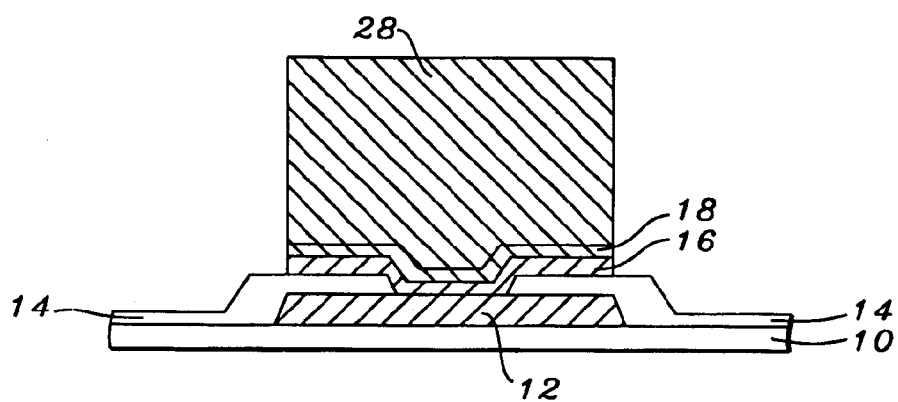
FIG. 5 – Prior Art
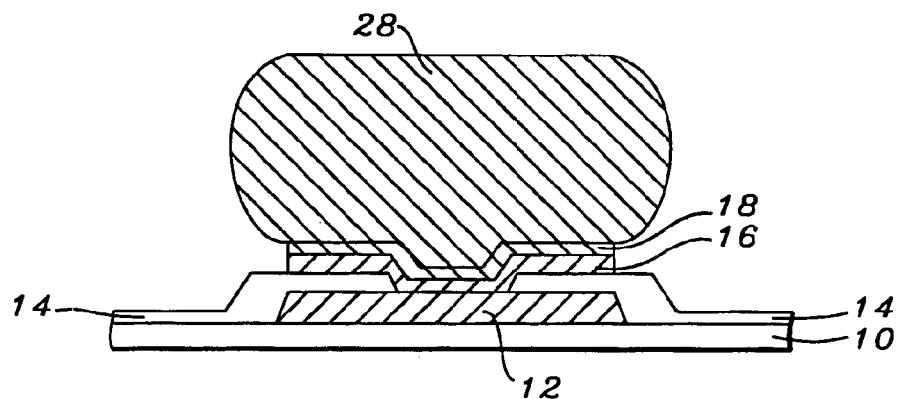
FIG. 6 – Prior Art

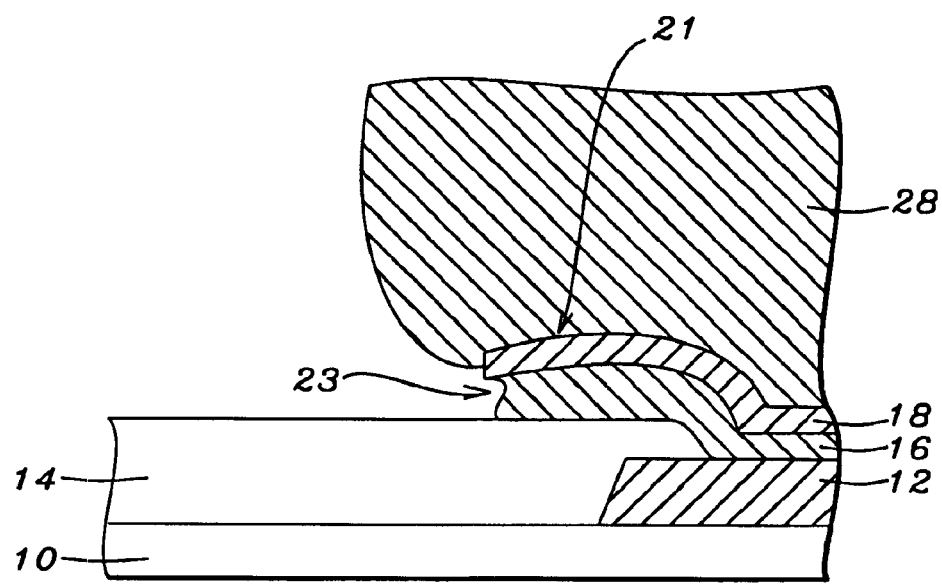
FIG. 7 – Prior Art

BUMPING PROCESS TO INCREASE BUMP HEIGHT AND TO CREATE A MORE ROBUST BUMP STRUCTURE

This is a division of patent application Ser. No. 09/950,227, filed Sep. 10, 2001, titled "New Bump Process to Increase Bump Height and to Create a More Robust Bump Structure," which issued on Aug. 12, 2003 as U.S. Pat. No. 6,605,524.

BACKGROUND OF THE INVENTION (1) Field of the Invention

The invention relates to the fabrication of integrated circuit devices, and more particularly, to a method of creating interconnect bumps of improved height and reliability.

(2) Description of the Prior Art

In the art of creating semiconductor devices, many mutually supporting technologies are used. While a considerable amount of attention is typically dedicated to the creation of the semiconductor device per se, these devices after their creation must be further connected to surrounding circuitry or to other semiconductor devices. For the connections that must be made to the semiconductor device itself, various techniques have been developed and are in current use. In order to be able to electrically interface with the die, points of interconnect must be provided on a surface of the die. This has led to a number of divergent approaches such as the creation of Ball Grid Array (BGA) devices, Land Grid Array (LGA) and Pin Grid Array (PGA) devices, Chip Scale Packaging (CSP) and Quad Flat Pack (QFP) devices. One of the salient developments is the creation of the flip chip which has a pattern or array of interconnect points spaced over the active surface of the die, the flip chip is mounted face-down to the surface of a substrate. The methods that are used to create the points of electrical interconnect on the surface of the flip essentially follows one of two approaches, that is the method whereby a solder bump is created and the method whereby a contact ball is created. Both methods start from a pad electrode that provides direct electrical interface with the die. In the method whereby a solder bump is created, a barrier layer is typically first blankly deposited over the surface of the wafer that contains the flip chip, the barrier layer typically comprising titanium or nickel or chromium, deposited using vacuum deposition methods or metal sputtering. After the barrier layer has been deposited, solder layers are selectively formed over the pad electrodes by methods of vacuum deposition or electrolytic plating or solder ball formation. For the method whereby a contact ball is created, ball bonding is performed over the surface of the pad electrodes by wire-bonding a (typically gold) wire to the pad electrode thus forming the contact ball.

In the formation of points of electrical contact on the surface of a semiconductor die, normal considerations of cost and reliability continue to play an important role. This places the method of forming solder bumps, the first of the two highlighted methods, at a disadvantage since this method requires the application of a barrier layer. Solder bump reliability further requires that the solder bump is of a reasonable sturdy construction, implying that the solder ball must have an adequate height from which follows that the vacuum deposition of the layer of solder (over the barrier layer) can become too time-consuming, further increasing the cost of using the solder bump method. The method of electrolytic plating that has been indicated above as being applicable for the formation of solder bumps does not lend itself to adequate control over the dimensional parameters of the solder bumps that are created. This is caused by the nature of the solder deposition of this method, whereby the deposition of the solder is heavily dependent on the energy (electric field distribution) that is applied for the formation of each solder bump while, since the solder bumps must be uniformly and simultaneously created for a large number of points of electrical contact, a common electrode is required to interconnect all contact pads over which solder bumps are to be created.

The ball bonding method has the disadvantage that each contact pad must be provided with a contact ball, placing a severe limitation on device throughput, making this method not suitable for high speed throughput and therefore for modern, cost effective production methods. In addition, since the method of contact ball formation depends on thermal treatment of interfacing surfaces, this method leads to poor reliability performance of the device and frequently leads to more sophisticated methods of contact ball creation which again add cost to the process.

The invention addresses these and other concerns by addressing issues of providing a solder bump of adequate height, the issue of missing solder bumps and the issue of the solder bump processing time or window.

U.S. Pat. No. 6,211,052 (Farnworth) shows a UBM and bump process using photoresist.

U.S. Pat. No. 5,904,156 (Advocate) shows a process for a dry film resist removal in the presence of electroplated bumps.

U.S. Pat. No. 5,914,274 (Yamaguchi) shows a substrate on which bumps are formed and a method of forming same.

U.S. Pat. No. 5,903,058 (Akram) shows a process for conductive bumps on a die.

SUMMARY OF THE INVENTION

A principle objective of the invention is to provide a method for the creation of a solder bump that provides a solder bump of increased height.

Another objective of the invention is to provide a method for the creation of a solder bump that provides a solder bump of improved robustness.

Another objective of the invention is to provide a method for the creation of a solder bump that provides a solder bump of different height by adjusting the thickness of a layer of polyimide that is used in the process of solder bump creation, this without the need for modification of the layer of Under Bump Metal.

A still further objective of the invention is to provide a method of creating solder bumps that eliminates missing solder bumps.

A still further objective of the invention is to provide a method of creating solder bumps that extends the processing window that is required for the creation of the solder bump.

A still further objective of the invention is to provide a method of creating solder bumps that extends the processing window that is required for the packaging of a semiconductor die and that further improves package yield.

In accordance with the objectives of the invention a new process is provided which is an extension and improvement of present processing for the creation of a solder bump. After the layers of Under Bump Metal and a layer of solder metal have been created in patterned and etched format and overlying the contact pad, following a conventional processing sequence, a layer of polyimide is deposited. The solder flow is performed using the thickness of the deposited layer of polyimide to control the height of the column underneath the reflow solder.

BRIEF DESCRIPTION OF THE DRAWINGS

FIGS. 1 through 7 address prior art methods of forming a solder ball, as follows:

FIG. 1 shows a cross section of a semiconductor surface on which a contact pad has been provided, a layer of passivation has been deposited over the semiconductor surface and has been patterned and etched, exposing the surface of the aluminum pad. A seed layer has been blanket deposited, a film of Under Ball Metallurgy has been blanket deposited over the seed layer.

FIG. 2 shows the cross section of FIG. 1 after a photoresist mask has been created.

FIG. 3 shows the cross section of FIG. 3 after the exposed surface of UBM has been electro plated with a layer of solder.

FIG. 4 shows a cross section after the photoresist mask has been removed.

FIG. 5 shows a cross section after the layers of UBM and the seed layer have been etched.

FIG. 6 shows a cross section after reflow of the solder material.

FIG. 7 highlights problems encountered with current methods of forming a solder ball.

FIGS. 8 through 12 are identical with FIGS. 1 through 5 and have been included to show a complete processing cycle of the invention.

FIG. 13 shows a cross section after a layer of polyimide has been deposited over the structure that is shown in cross section in FIG. 12.

FIG. 14 shows a cross section after reflow of the deposited solder material.

DESCRIPTION OF THE PREFERRED EMBODIMENTS

Figure 8:
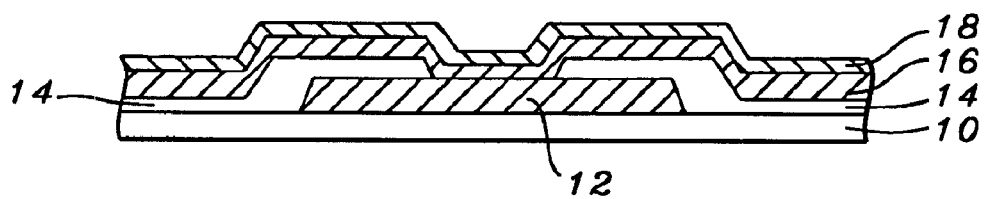
FIGS. 8 through 14 address the invention, as follows.

Conventional methods of forming a solder bump will first be highlighted in order to facilitate comparison with the invention.

Referring now specifically to FIG. 1, there is shown a cross section of a semiconductor surface 10 on which:

a contact pad 12 has been provided; contact pad 12 preferably comprises aluminum or an aluminum alloy or copper a layer 14 of passivation has been deposited over the semiconductor surface 10 and has been patterned and etched partially exposing the surface of the aluminum pad 12 in-situ sputter clean has been performed of the exposed surface of the contact pad a seed layer 16 has been blanket deposited over the surface of the layer 14 of passivation including the exposed surface of the contact pad 12, and a film 18 of Under Ball Metallurgy has been blanket deposited over the seed layer.

Layer 10 is the surface of a semiconductor layer, a contact pad 12 has been created on surface 10. Surface 10 will typically be the surface of a semiconductor substrate, the surface of an interconnect substrate and the like. A contact pad 12 has been created on surface 10, electrical contact must be established with contact pad 12 by means of an overlying solder bump. Contact pad 12 serves as an interface between the solder bump and electrical interconnects that are provided in the surface of layer 10.

A layer 14 of passivation that may, for instance, contain Plasma Enhanced silicon nitride (PE $Si_3N_4$), is deposited over the surface of layer 10 and of contact pad 12.

Insulating/passivation layers such as silicon oxide and oxygen-containing polymers are deposited over the surface of various layers of conducting lines in a semiconductor device or substrate to separate the conductive interconnect lines from each other, the insulating layers can be deposited using Chemical Vapor Deposition (CVD) techniques. The insulating layers are deposited over patterned layers of interconnecting lines where electrical contact between successive layers of interconnecting lines is established with metal vias created for this purpose in the insulating layers. Electrical contact to the chip is typically established by means of bonding pads or contact pads that form electrical interfaces with patterned levels of interconnecting metal lines. Signal lines and power/ground lines can be connected to the bonding pads or contact pads. After the bonding pads or contact pads have been created on the surfaces of the chip package, the bonding pads or contact pads are passivated and electrically insulated by the deposition of a passivation layer over the surface of the bonding pads. A passivation layer can contain silicon oxide/silicon nitride ($SiO_2/Si_3N_4$) deposited by CVD. The passivation layer is patterned and etched to create openings in the passivation layer for the bonding pads or contact pads after which a second and relatively thick passivation layer can be deposited for further insulation and protection of the surface of the chips from moisture and other contaminants and from mechanical damage during assembling of the chips.

Various materials have found application in the creation of passivation layers. Passivation layer can contain silicon oxide/silicon nitride ($SiO_2/Si_3N_4$) deposited by CVD, a passivation layer can be a layer of photosensitive polyimide or can comprise titanium nitride. Another material often used for a passivation layer is phosphorous doped silicon dioxide that is typically deposited over a final layer of aluminum interconnect using a Low Temperature CVD process. In recent years, photosensitive polyimide has frequently been used for the creation of passivation layers. Conventional polyimides have a number of attractive characteristics for their application in a semiconductor device structure, which have been highlighted above. Photosensitive polyimides have these same characteristics but can, in addition, be patterned like a photoresist mask and can, after patterning and etching, remain on the surface on which it has been deposited to serve as a passivation layer. Typically and to improve surface adhesion and tension reduction, a precursor layer is first deposited by, for example, conventional photoresist spin coating. The precursor is, after a low temperature pre-bake, exposed using, for example, a step and repeat projection aligner and Ultra Violet (UV) light as a light source. The portions of the precursor that have been exposed in this manner are cross-linked, thereby leaving unexposed regions (that are not cross-linked) over the bonding pads. During subsequent development, the unexposed polyimide precursor layer (over the bonding pads) is dissolved, thereby providing openings over the bonding pads. A final step of thermal curing leaves a permanent high quality passivation layer of polyimide over the substrate.

The preferred material of the invention for the deposition of layer 14 of passivation is Plasma Enhanced silicon nitride (PE $Si_3N_4$), deposited using PECVD technology at a temperature between about 350 and 450 degrees C. with a pressure of between about 2.0 and 2.8 Torr for the duration between about 8 and 12 seconds. Layer 34 of PE $Si_3N_4$ can be deposited to a thickness between about 12 and 15 µm.

Layer 14 of PE $Si_3N_4$ is next patterned and etched to create an opening in the layer 14 that overlays and aligns with the underlying contact pad 12.

The etching of layer 14 can use $Ar/CF_4$ as an etchant at a temperature of between about 120 and 160 degrees C. and a pressure of between about 0.30 and 0.40 Torr for a time of between about 33 and 39 seconds using a dry etch process.

The etching of layer 14 can also use $He/NF_3$ as an etchant at a temperature of between about 80 and 100 degrees C. and a pressure of between about 1.20 and 1.30 Torr for a time of between about 20 and 30 seconds using a dry etch process.

For the in-situ sputter clean, a sputter ion-milling tool can be used using Ar mixed with $H_2$ as a cleaning agent (sputter source).

For the seed layer 16 that is blanket deposited over the surface of the layer 14 of passivation, including the exposed surface of the contact pad 12, any of the conventional metallic seed materials can be used. The metallic seed layer can be deposited using a sputter chamber or an Ion Metal Plasma (IMP) chamber at a temperature of between about 0 and 300 degrees C. and a pressure of between about 1 and 100 mTorr, using (for instance) copper or a copper alloy as the source (as highlighted above) at a flow rate of between about 10 and 400 sccm and using argon as an ambient gas.

Layer 18 of UBM, typically of nickel and of a thickness between about 1 and 10 $\mu$m, has been deposited by vacuum evaporation or by electroplating, this layer is as yet to be patterned and etched. Layer 18 may contain multiple layers of metal such as layers of chrome, followed by a layer of copper, followed by a layer of gold.

FIG. 2 shows the cross section of the semiconductor surface 10 after a layer 20 of photoresist has been deposited over the layer 18 of UBM. Layer 20 of photoresist has been patterned and developed, creating opening 22 in the layer 20 of photoresist, partially exposing the surface of the layer 18 of UBM overlying the contact pad 12 where the interconnect bump is to be formed.

Layer 20 of photoresist can be deposited or laminated to a thickness of between about 2,000 and 8,000 Angstrom or between about 50 and 120 $\mu$m. The methods used for the deposition or lamination and development of the layer 20 of photoresist apply conventional methods of photolithography. Photolithography is a common approach wherein patterned layers are usually formed by spinning or by laminating on a layer of photoresist, projecting light through a photomask with the desired pattern onto the photoresist to expose the photoresist to the pattern, developing the photoresist, washing off the unexposed photoresist, and plasma etching to clean out the areas where the photoresist has been washed away. The exposed resist may be rendered insoluble (negative working) and form the pattern, or soluble (positive working) and be washed away.

The layer 20 of photoresist will, after patterning and developing, remain in place in an area above the aluminum pad 12 that surrounds the pad 12 and that is adjacent to the pad 12. The deposited layer 18 of photoresist can, prior to patterning and etching, be cured or pre-baked further hardening the surface of the layer of photoresist.

Layer 20 of photoresist can be etched by applying $O_2$ plasma and then wet stripping by using $H_2SO_4$, $H_2O_2$ and $NH_4OH$ solution. Sulfuric acid ($H_2SO_4$) and mixtures of $H_2SO_4$ with other oxidizing agents such as hydrogen peroxide ($H_2O_2$) are widely used in stripping photoresist after the photoresist has been stripped by other means. Wafers to be stripped can be immersed in the mixture at a temperature between about 100 degrees C. and about 150 degrees C. for 5 to 10 minutes and then subjected to a thorough cleaning with deionized water and dried by dry nitrogen. Inorganic resist strippers, such as the sulfuric acid mixtures, are very effective in the residual free removal of highly postbaked resist. They are more effective than organic strippers and the longer the immersion time, the cleaner and more residue free wafer surface can be obtained.

The photoresist layer 20 can also be partially removed using plasma oxygen ashing and careful wet clean. The oxygen plasma ashing is heating the photoresist in a highly oxidized environment, such as an oxygen plasma, thereby converting the photoresist to an easily removed ash. The oxygen plasma ashing can be followed by a native oxide dip for 90 seconds in a 200:1 diluted solution of hydrofluoric acid.

Layer 20 of photoresist can additionally be cured after the layer of photoresist has been deposited and before the layer of photoresist is patterned and developed. This curing of the layer of photoresist can be performed in a $N_2$ gas ambient, at a temperature of between about 300 and 400 degrees C., for a time period between about 1.5 and 2.5 hours, and a pressure of 760 Torr.

FIG. 3 shows a cross section of the semiconductor surface 10 after the exposed surface of layer 18 of UBM, that is surface of layer 18 of UBM that is exposed inside opening 22, has been electro plated with layer 28 of solder. Layer 28 is bounded by the etched layer 20 of photoresist. During the process of the electroplating, the layer 18 of UBM serves as the cathode of the plating tool.

Additionally and as a pre-cursor to the processing step of depositing solder alloy 28 over the surface of the layer of UBM, additional layers of metal may be electroplated over the exposed surface of the layer 18 of UBM. These layers are not shown in the cross section of FIG. 3, the additional layers can for instance comprise copper or nickel.

The layer 28 of bump metal (typically solder) is electroplated in contact with the layers 18, to a thickness of between about 30 and 100 $\mu$m but more preferably to a thickness of about 50 $\mu$m.

FIG. 4 shows the cross section of the semiconductor surface after the patterned layer 20 of photoresist has been stripped from the surface of the layer 18 of UBM. The previously highlighted processing conditions for the removal of photoresist can be equally applied to the stripping of the photoresist that is shown in FIG. 4, these conditions therefore do not need to be further highlighted at this time.

FIG. 5 shows a cross section of the semiconductor surface 10 after the layers 18 (of UBM) and 16 (of seed material) have been etched using the created layer 28 of solder as a mask. Standard RIE procedures, using $Cl_2$—$BCl_3$ as etchant, can be used to etch the layers 18 and 16 of UBM and seed material.

As a final figure of the highlighted prior art processing sequence FIG. 6 shows the creation of solder ball 28 after the patterned layer 28 of solder that is shown in cross section in FIG. 5 has been submitted to reflow by applying heat to the structure. For this processing step, a flux is applied to the solder layer 28 and the solder is melted in a reflow surface under a nitrogen atmosphere, forming the spherically shaped solder bump 28 that is shown in cross section in FIG. 6.

An essential weakness of the processing steps that have been described using FIGS. 1 through 6 is demonstrated in the cross section that is shown in FIG. 7. Layer 24, of seed material and layer 18 of UBM are shown. Where FIG. 6 shows a cross section in which layers 16 and 18 have, around the perimeter of these layers, a surface that is essentially flat, actual cross section taken of the structure that has been created following the processing steps of FIGS. 1 through 6 have a profile that is shown in cross section in FIG. 7. From this actual cross section it is clear that the desired planarity if layers 16 and 18 in the perimeter of these layers is not the present but that both layers show a significant amount of upward bulging 21. This upward sloping profile 21 of layers 16 and 18 results in an undercut 23 where layer 18 is not fully present underneath layer 16. The end result of the indicated non-planarity 21 and the undercut 23 is that the profile of solder bump 28 does not have (the desired) spherical shape leading to significant problems of interconnect and interconnect reliability of the solder bump 28.

In addition, for closely spaced solder bumps (which are increasingly required in view of the continuing increase in device density) the solder bump 28 is likely to sag sideways as a result of undercut 23. This sideways motion of the solder bump 28 additionally brings the surface of the solder ball which is closest to an adjacent solder ball even closer to the adjacent solder ball, making actual contact between adjacent solder balls a very real possibility.

Keeping the preceding drawings and the processing steps that have been described using these drawings in mind, the invention will now be described. A number of the processing steps of the invention are identical to the prior art processing steps that have been described above.

For purposes of completeness, drawings that apply to both prior art processing and the invention will be repeated at this time. Repetition in the text will be avoided by limiting related text for drawings that have previously been described.

FIG. 8 is identical to FIG. 1, in sum:

a contact pad 12 has been provided a layer 14 of passivation has been deposited over the semiconductor surface 10 and has been patterned and etched partially exposing the surface of the aluminum pad 12 in-situ sputter clean has been performed of the exposed surface of the contact pad a seed layer 16 has been blanket deposited over the surface of the layer 14 of passivation including the exposed surface of the contact pad 12, and a film 18 of Under Ball Metallurgy has been blanket deposited over the seed layer.

Figure 9:
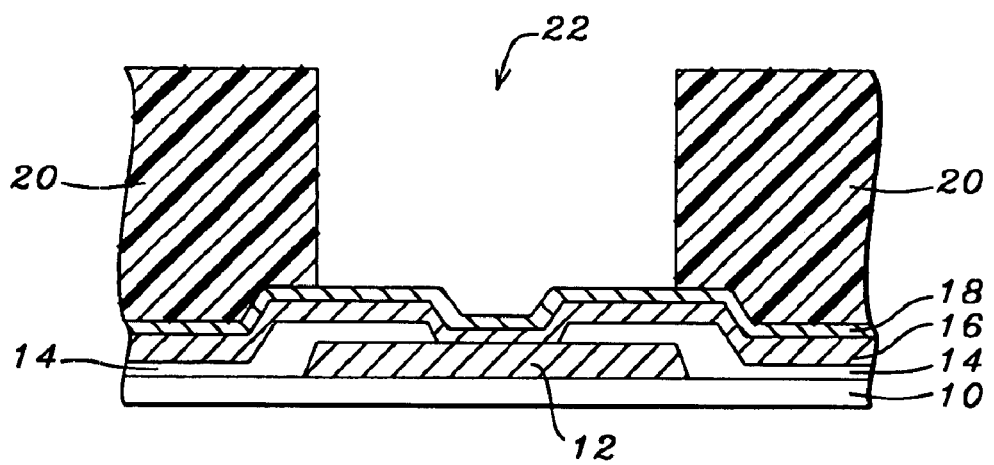

FIG. 9 is identical with FIG. 2, a layer 20 of photoresist has been deposited over the layer 18 of UBM. Layer 20 of photoresist has been patterned and developed, creating opening 22 in the layer 20 of photoresist, partially exposing the surface of the layer 18 of UBM overlying the contact pad 12 where the interconnect bump is to be formed.

Figure 10:
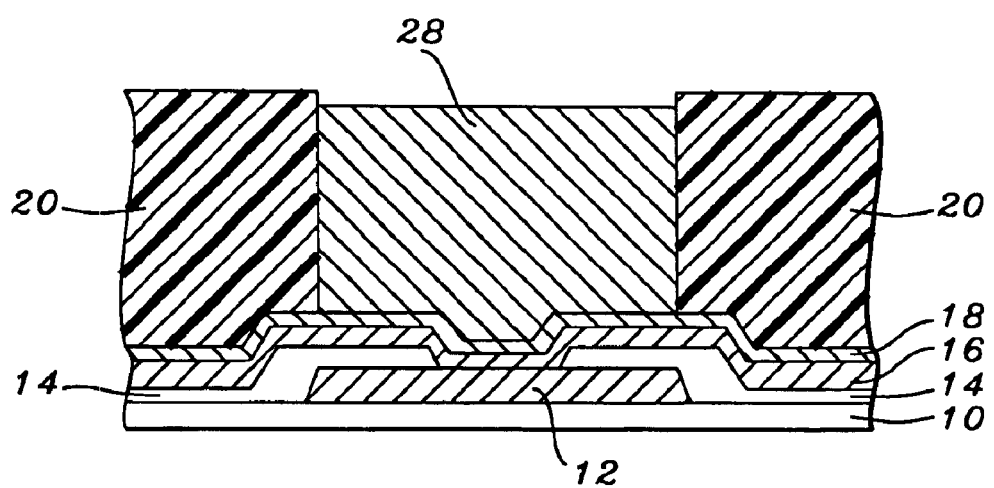

FIG. 10 is identical with FIG. 3, the exposed surface of layer 18 of UBM has been electro plated with a layer 28 of solder.

Figure 11:
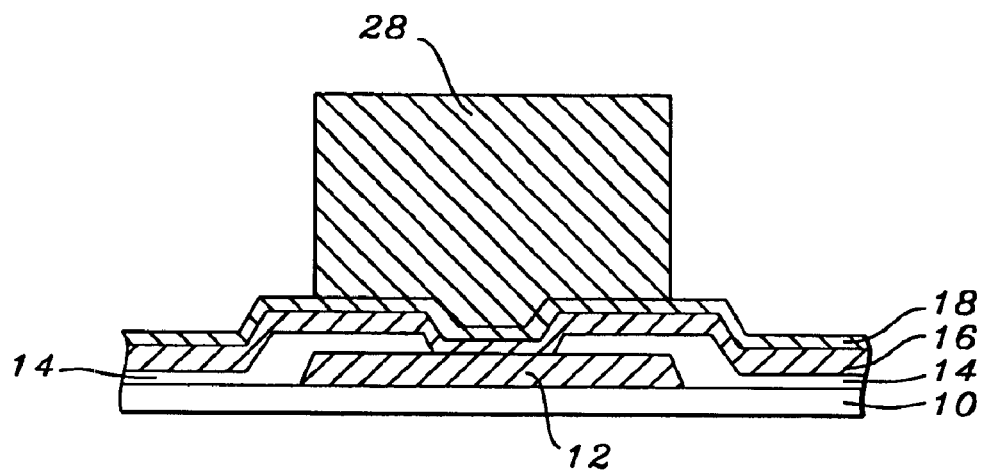

FIG. 11 is identical with FIG. 4, the patterned layer 20 of photoresist has been stripped from the surface of the layer 18 of UBM.

Figure 12:
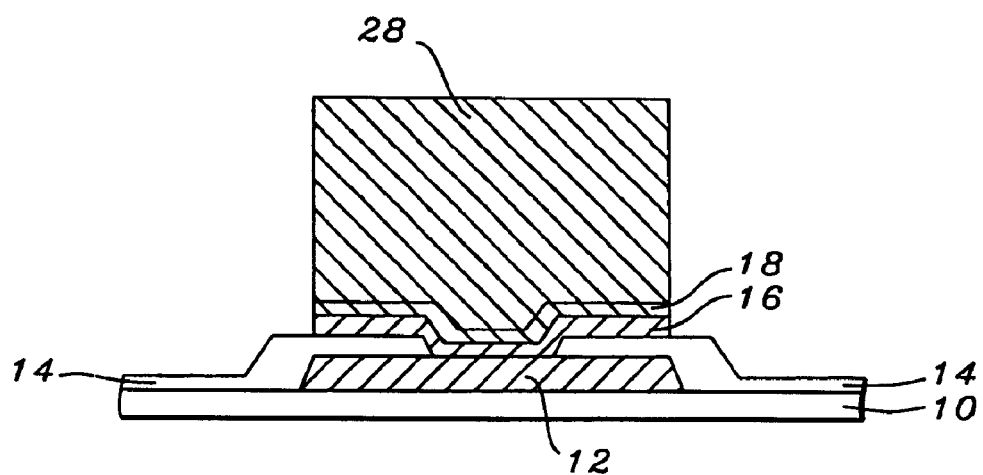

FIG. 12 is identical with FIG. 5, the layers 18 (of UBM) and 16 (of seed material) have been etched using the created layer 28 of solder as a mask.

Figure 13:
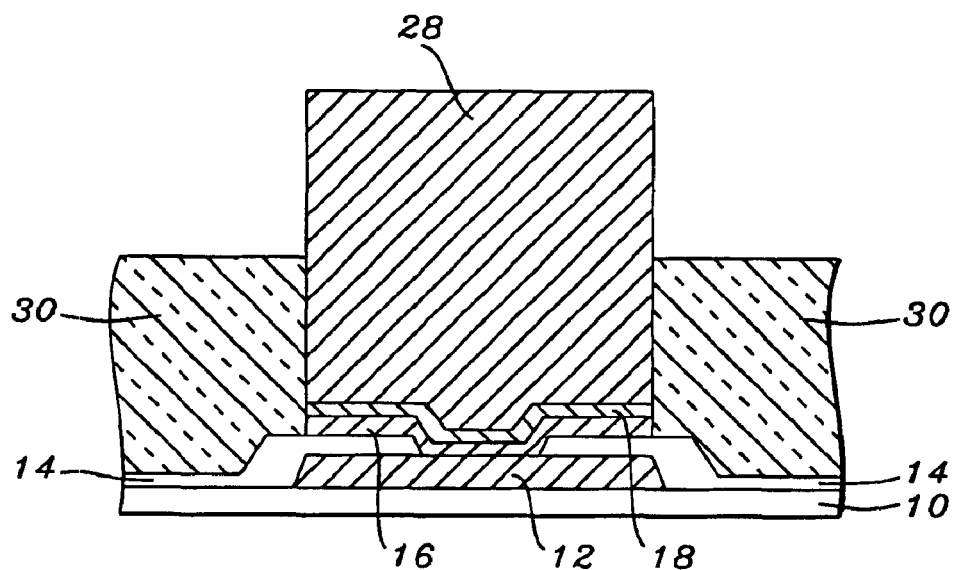

FIG. 13 is a novel processing step of the invention. A layer 30 of polyimide has been coated over the surface of the structure of FIG. 12. The use of polyimide films as intra and inter-level dielectrics offer a number of advantages for such applications. For instance, polyimides produce surfaces in which the step heights of underlying features are reduced, and step slopes are gentle and smooth. Cured polyimide films can tolerate temperatures of up to 500 degrees C. without degradation of their dielectric film characteristics. Polyimide films have dielectric breakdowns, which are only slightly lower than that of $SiO_2$ while the dielectric constant of polyimides is smaller than that of silicon nitride and of $SiO_2$. Finally, the process of depositing polyimide and pattern polyimide films is relatively simple.

Polyimide processing is a well understood semiconductor art and is designed to give extra protection to the surface of the silicon chip against scratching, cracking and other types of mechanical damage. Polyimide is typically applied over the surface of the entire substrate. Most often, mechanical damage occurs during assembly, packaging or any subsequent handling of the die. As a passivation layer, polyimide also guards against thin film cracking which frequently results from the packaging of very large dies into plastic packages.

Existing polyimide processes are compatible with standard forms of wire bonding technology. Polyimide is typically spun on in the form of a liquid (polyamic-acid precursor). Normal defects, such as cracks or flakes, which arise from the interaction of the polyimide with photoresist, do not normally pose a problem for this standard bonding technology. However, as newer forms of bonding technology For many applications, the remaining (after develop) polyimide is cured to cross-linked in order to protect the device circuitry. This step is a high temperature cure, which evaporates the solvents in the polyimide, typically at 350 degrees C. for 120 minutes. Etching of the cured film often uses oxygen or fluorine based plasma.

The above referenced material that is used for the deposition of layer 30 is polyimide, the material that can be used for this layer is not limited to polyimide but can contain any of the known polymers ($SiCl_xO_y$). The indicated polyimide is the preferred material to be used for the processes of the invention for the thick layer 30 of polymer. Examples of polymers that can be used are silicons, carbons, fluoride, chlorides, oxygens, parylene or teflon, polycarbonate (PC), polysterene (PS), polyoxide (PO), poly polooxide (PPO), benzocyclobutene (BCB).

For the deposition of layer 30 the Hitachi-Dupont polyimide HD 2732 or 2734 or Ashahi polyimide can, for example, be used. The polyimide can be spin-on coated and cured. After spin-on coating, the polyimide will be cured at 400 degrees C. for 1 hour in a vacuum or nitrogen ambient. For thicker polyimide, the polyimide film can be multiple coated and cured. This step of coating of the polyimide can also be performed at room temperature and ambient pressure for a time of between about 30 and 40 seconds. The indicated processing parameters are not critical since the polyimide thickness is controlled by spin speed.

It is clear from the above and from the cross section that is shown in FIG. 13, that the thickness of the layer 30 of polyimide can be controlled and selected to be a desirably value, this especially in relation to the height of the column 28 of solder material. This implies that the height over which the solder column 28 protrudes above the surface of the (final or etched) layer 30 can be controlled from which follows that the diameter of the solder balls that is created by reflowing the solder column can be controlled. Most importantly is the observation that the layer 30 of polyimide provides adequate thermal protection to underlying layers 16, 18, 24 and 26 resulting in a final profile of these layers that does not show the effects of bulging (21, FIG. 7) and under-cut (23, FIG. 7) that occur using conventional methods of creating a solder bump (as previously highlighted).

Figure 14:
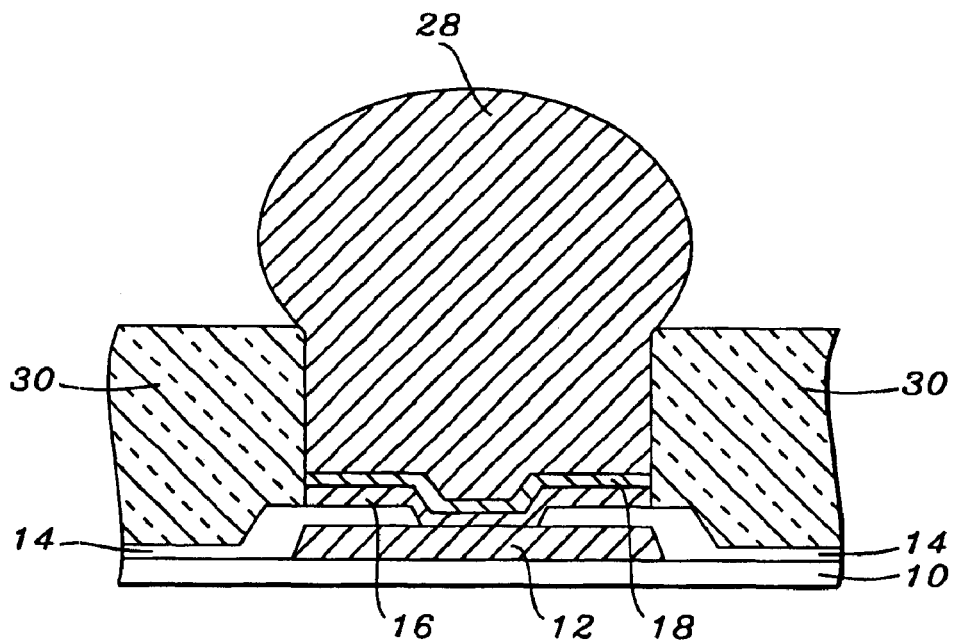

Remains for the column of solder material that protrudes above the layer 30 of polyimide to be shaped into a solder ball by exposing the structure to heat. For this processing step, a flux is applied to the solder layer 28 and the solder is melted in a reflow surface under a nitrogen atmosphere, forming the spherically shaped solder bump 28 that is shown in cross section in FIG. 14.

The layer 30 of polyimide remains in place as part of the completed device, thus realizing the previously cited advantages that are provided by the use of polyimide as an intra-level of dielectric.

The comparison between conventional methods of creating a solder bump and the method of the invention can best be highlighted by briefly reviewing the processing sequence of both methods, as follows:

Conventional process flow:

provide a semiconductor substrate on the surface of which has been provided a contact pad, exposed through an opening in a layer of passivation deposit/sputter a layer of seed material sputter/plating a layer of UBM coat a layer of photoresist pattern and develop the layer of photoresist, creating an opening in the layer of photoresist that aligns with the exposed surface of the contact pad solder plate a layer inside the opening created in the layer of photoresist remove the developed layer of photoresist etch the layer of UBM and the layer of seed material, using the solder plated solder as a mask reflow the solder.

The process flow of the invention is, showing the new processing steps of the invention between asterisks:

provide a semiconductor substrate on the surface of which has been provided a contact pad, exposed through an opening in a layer of passivation deposit/sputter a layer of seed material sputter/plating a layer of UBM coat a layer of photoresist pattern and develop the layer of photoresist, creating an opening in the layer of photoresist that aligns with the exposed surface of the contact pad solder plate a layer inside the opening created in the layer of photoresist remove the developed layer of photoresist etch the layer of UBM and the layer of seed material, using the solder plated solder as a mask ★ coat a layer of polyimide to a thickness ★

★ optionally, reduce the thickness of the coated layer of polyimide by etching the layer of polyimide ★ reflow the solder.

It is clear from the invention that the thickness of the layer of polyimide, which serves as a control agent during the reflow of the layer of solder, can be selected such that the height of the solder bump can be selected. The solder that is surrounded by the layer of polyimide will not reflow, the solder that is exposed from the surface of the layer of polyimide will reflow.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. A semiconductor structure, comprising:
   at least one contact pad provided on the surface of a substrate;
   a layer of passivation material deposited over the surface of said substrate, said layer of passivation material having at least one opening that aligns with said at least one contact pad;
   at least one layer of seed material deposited over said layer of passivation material, the seed layer contacting a surface of the contact pad;
   at least one layer of Under Bump Metal (URM) deposited over the surface of said layer of seed material;
   at least one layer of solder material having a solder height provided over the surface of said at least one layer of UBM;
   a layer of polymer material deposited over the layer of passivation material to a polymer thickness, said polymer thickness being less than said solder height, said polymer contacting said layer of solder material over a substantial portion of the thickness of the polymer layer; the polymer layer further having an opening aligned with the contact pad;
   wherein the solder layer is disposed within the opening in the polymer layer, the solder layer height being greater than the polymer layer thickness; the solder layer comprising a column portion having a substantially cylindrical shape with a first diameter and a bump portion having a second diameter, the bump portion further having a substantially spherical shape; and
   wherein the column portion is disposed within the opening and has a height substantially equal to the polymer layer thickness, the bump portion extends above a top surface of the polymer layer thickness, and the first diameter is substantially smaller than the second diameter.

2. The semiconductor structure of claim 1, said at least one contact pad comprising aluminum or an aluminum alloy.

3. The semiconductor structure of claim 1, said at least one layer of UBM comprising a layer of nickel, created to a thickness between about 1 and 10 $\mu$m.

4. The semiconductor structure of claim 1, said at least one layer of UBM comprising a layer of chrome, followed by a layer of copper, followed by a layer of gold, created to a thickness between about 1 and 10 $\mu$m.

5. The semiconductor structure of claim 1, said at least one layer of UBM comprising multiple layers of metal.

6. The semiconductor structure of claim 1, wherein the layer of UBM is formed by electroplating.

7. The semiconductor structure of claim 1, wherein the layer of polymer comprises a polyimide.

8. The semiconductor structure of claim 1, wherein the polymer layer thickness is sufficient to prevent deformation of the URM layer during thermal processing of the structure.

9. The semiconductor structure of claim 8, wherein the thermal processing comprises applying a temperature to the structure sufficient to reflow the solder layer.

10. The semiconductor structure of claim 1, wherein the polymer layer comprises multiple individual coats of polymer material.

11. A semiconductor structure comprising:
    a semiconductor substrate having at least one contact pad;
    a passivation layer provided on a surface of the substrate, the passivation layer having at least one opening to expose at least a portion of the contact pad;

a seed layer provided over a portion of the passivation layer and the exposed portion of the contact pad;

an Under Bump Metal (UBM) layer provided over the seed layer;

at least one layer of solder material provided over the UBM layer, the solder material having a height;

a polymer layer provided over the passivation layer and surrounding said solder layer; said polymer contacting said layer of solder material over a substantial portion of the thickness of the polymer layer; the polymer layer having a thickness smaller than the solder material height;

wherein the layer of solder material comprises first and second portions, the first portion having a cylindrical shave with a height substantially equal to the thickness of the polymer layer, the second portion disposed above a top surface of the polymer layer and having a spherical shape with a diameter substantially greater than the diameter of the first portion.

12. The semiconductor structure of claim 11, wherein adjusting the thickness of the polymer layer adjusts the diameter of the second portion when said solder layer is subjected to a reflow temperature.

13. The semiconductor structure of claim 12, wherein the second portion has a height, and wherein adjusting the thickness of the polymer layer adjusts the height of the second portion when said solder layer is subjected to the reflow temperature.

14. The semiconductor structure of claim 11, wherein the polymer layer comprises a polyimide.

15. The semiconductor structure of claim 11, wherein said contact pad comprises aluminum or an aluminum alloy.

16. The semiconductor structure of claim 11, wherein said UBM layer comprises nickel having a thickness between about 1 and 10 $\mu$m.

17. The semiconductor structure of claim 11, wherein said UBM layer comprises multiple layers of metal.

18. The semiconductor structure of claim 11, wherein said UBM layer comprises a layer of chrome, followed by a layer of copper, followed by a layer of gold, having a total thickness between about 1 and 10 $\mu$m.

19. The semiconductor structure of claim 11, wherein the polymer layer thickness is sufficient to prevent deformation of the UBM layer during thermal processing of the structure.

20. The semiconductor structure of claim 19, wherein the thermal processing comprises applying a temperature to the structure sufficient to reflow the solder layer.

* * * * *

UNITED STATES PATENT AND TRADEMARK OFFICE
CERTIFICATE OF CORRECTION

| | |
|---|---|
| PATENT NO. | : 6,956,292 B2 |
| APPLICATION NO. | : 10/613694 |
| DATED | : October 18, 2005 |
| INVENTOR(S) | : Fan et al. |

It is certified that error appears in the above-identified patent and that said Letters Patent is hereby corrected as shown below:

Claim 8, line 56, delete "(URM)" and insert --(UBM)--.
Claim 11, line 26, delete "shave" and insert --shape--.

Signed and Sealed this

Sixth Day of November, 2007

JON W. DUDAS
*Director of the United States Patent and Trademark Office*

UNITED STATES PATENT AND TRADEMARK OFFICE
CERTIFICATE OF CORRECTION

PATENT NO. : 6,956,292 B2  Page 1 of 1
APPLICATION NO. : 10/613694
DATED : October 18, 2005
INVENTOR(S) : Yang-Tung Fan et al.

It is certified that error appears in the above-identified patent and that said Letters Patent is hereby corrected as shown below:

Column 10, line 14, delete "(URM)" and insert -- "(UBM)" -- therefor.

Signed and Sealed this

First Day of April, 2008

JON W. DUDAS
*Director of the United States Patent and Trademark Office*